United States Patent [19]
Damon

[11] 3,891,898
[45] June 24, 1975

[54] PANEL BOARD MOUNTING AND INTERCONNECTION SYSTEM FOR ELECTRONIC LOGIC CIRCUITRY

[75] Inventor: Neil F. Damon, Cumberland, R.I.

[73] Assignee: Augat, Inc., Attleboro, Mass.

[22] Filed: Oct. 11, 1973

[21] Appl. No.: 405,500

[52] U.S. Cl... 317/101 CC; 174/DIG. 3; 339/17 CF
[51] Int. Cl. .............................................. H05k 1/04
[58] Field of Search .............. 317/101 CC, 101 CM; 339/17 CF, 17 C, 147 R, 276 A; 174/DIG. 3; 29/203 MU, 203 P

[56] References Cited

UNITED STATES PATENTS

| | | | |
|---|---|---|---|
| 3,088,087 | 4/1963 | Colten | 339/276 A |
| 3,197,766 | 7/1965 | Stein et al. | 317/101 D |
| 3,325,766 | 6/1967 | Kolb et al. | 339/17 CF |
| 3,740,697 | 6/1973 | Vanson | 339/276 A |

*Primary Examiner*—David Smith, Jr.
*Attorney, Agent, or Firm*—Weingarten, Maxham & Schurgin

[57] ABSTRACT

A panel board mounting and interconnection system for electronic logic circuitry. The system includes a panel board having arrays of wire wrapping pins projecting from one side, the other side of the board being adapted to receive integrated circuit modules and other electronic components for interconnection through leads connected to the wire wrapping pins. Selected pins within a single array are interconnected by means of a printed circuit substrate mounted to the pins parallel to the panel board, the printed circuit including passive elements such as resistors or capacitors or both.

8 Claims, 9 Drawing Figures

PANEL BOARD MOUNTING AND INTERCONNECTION SYSTEM FOR ELECTRONIC LOGIC CIRCUITRY

FIELD OF THE INVENTION

This invention relates in general to logic circuitry and more particularly concerns a mounting and interconnection system for such circuitry.

DISCUSSION OF THE PRIOR ART

The desire arrays improved density and miniaturization in electronic circuitry, specifically in logic circuitry, has led to widespread use of solderless contact techniques, notably wire wrapping. Where wire wrapping pins are used, wires are wrapped around the pins and used for interconnecting pins of different arraws with one another. In panels which are used in logic systems, and specifically for the very fast emitter coupled logic (ECL), resistive terminations are necessary. One method used for providing such a resistive termination between the end of a logic line and ground is to wire a discrete resistor by wire wrapping means between two pins. In a common sixteen-pin pattern there might be between four and six resistors, and on a typical one hundred eighty pattern board used in logic circuitry, sixty of the patterns may have terminating resistors on them. The use of discrete resistors has not been wholly satisfactory because to connect such elements, the wire wrapping gun bit must be changed to accommodate the normally larger and stiffer wire of the resistor. The strain on the resistor leads as well as on the relatively fragile wire wrapping pins is sometimes too great and the resistor may be damaged because of tension on the leads, or the pins may be distorted and otherwise damaged. Furthermore, a significant amount of time is spent in connecting 8–12 resistor leads in approximately one-third of the circuit arrays on a panel board.

Another approach for providing this resistive termination is to use dual-in-line (DIL) ECL terminators which conform in size and shape to the standard dual-in-line integrated circuit package. These are plugged into the contacts of wire wrapping pins on the side of the panel board opposite that from which the wire wrapping pins project. The disadvantage of this technique is that a considerable amount of panel board real estate is usurped by such terminator modules, thereby preventing many of the arrays on a board (approximately one-third) from being employed in active portions of the logic circuitry as would normally be expected.

SUMMARY OF THE INVENTION

This invention provides a means for connecting resistive terminations in logic circuitry employing wire wrapping panel boards in such a manner that the pins are not deformed or in any way damaged while all of the mounting locations on the opposite side of the board remain for integrated circuit package use as may be required for the circuitry involved. This invention overcomes the disadvantages of the prior art discussed above.

The invention may be employed with wire wrapping pins mounted in a panel board and having sockets adapted to receive the leads of a DIL integrated circuit package on one side of the panel board and projecting in the usual manner from the opposite side of the board. The pins in the panel board may be wire wrapped in the usual manner, some of them having no wire wrapping coil, some of them having one wire wrapping coil around the pin on the first wire wrapping level and some of them having two or more wire wrapping coils on the second and subsequent wire wrapping levels. To provide resistive terminations between pins, a substantially rigid substrate having printed circuitry on one side including areas of specific resistance values is mounted to the wire wrapping pins and makes electrical connection with selected ones of them. In a preferred embodiment, the substrate employs plated-through holes with contact pads surrounding the holes on both sides of the substrate. These holes are sufficiently large to encircle a coil of wrapped wire on a pin. Some of the holes through the substrate remain open but most of them are provided with a contact member adapted to provide physical and electrical contact with the wire wrapping pins adjacent their distal ends. An entire branch network of resistors, all having the same values, are provided on each substrate, and as many of those resistors may be used as are necessary. Those resistors which are not used may be easily physically disconnected from the remainder of the circuit. If desired, the printed circuit substrate may also include one or more capacitors for purposes of decoupling.

An alternative embodiment of the wire wrapping pins used in the panel board is disclosed, wherein instead of sockets on the opposite side of the board, the pins include resilient contacts projecting outwardly from the board to receive a carrier and IC combination in frictional engagement with the contacts.

This invention is particularly useful with high speed emitter coupled logic (ECL) and may be used to good advantage with a panel board having three voltage planes. However, any wire wrapping configuration may be employed since the substrate disclosed herein connects physically and electrically to the exposed ends of the wire wrapping pins and there is no dependence upon any other factor concerned with the board or the pins.

Another alternative embodiment is described where a complete integrated circuit package is mounted to the wire wrapping pins in place of the resistive substrate and using the principles of this invention. This would permit double logic circuitry on the same board space by having IC's on both sides of the same panel board.

BRIEF DESCRIPTION OF THE DRAWING

The advantages, features and objects of this invention will be more clearly understood from the following detailed description taken in conjunction with the accompanying drawing in which.

DESCRIPTION OF THE PREFERRED EMBODIMENTS

Figures 1, 2, 3, 4:
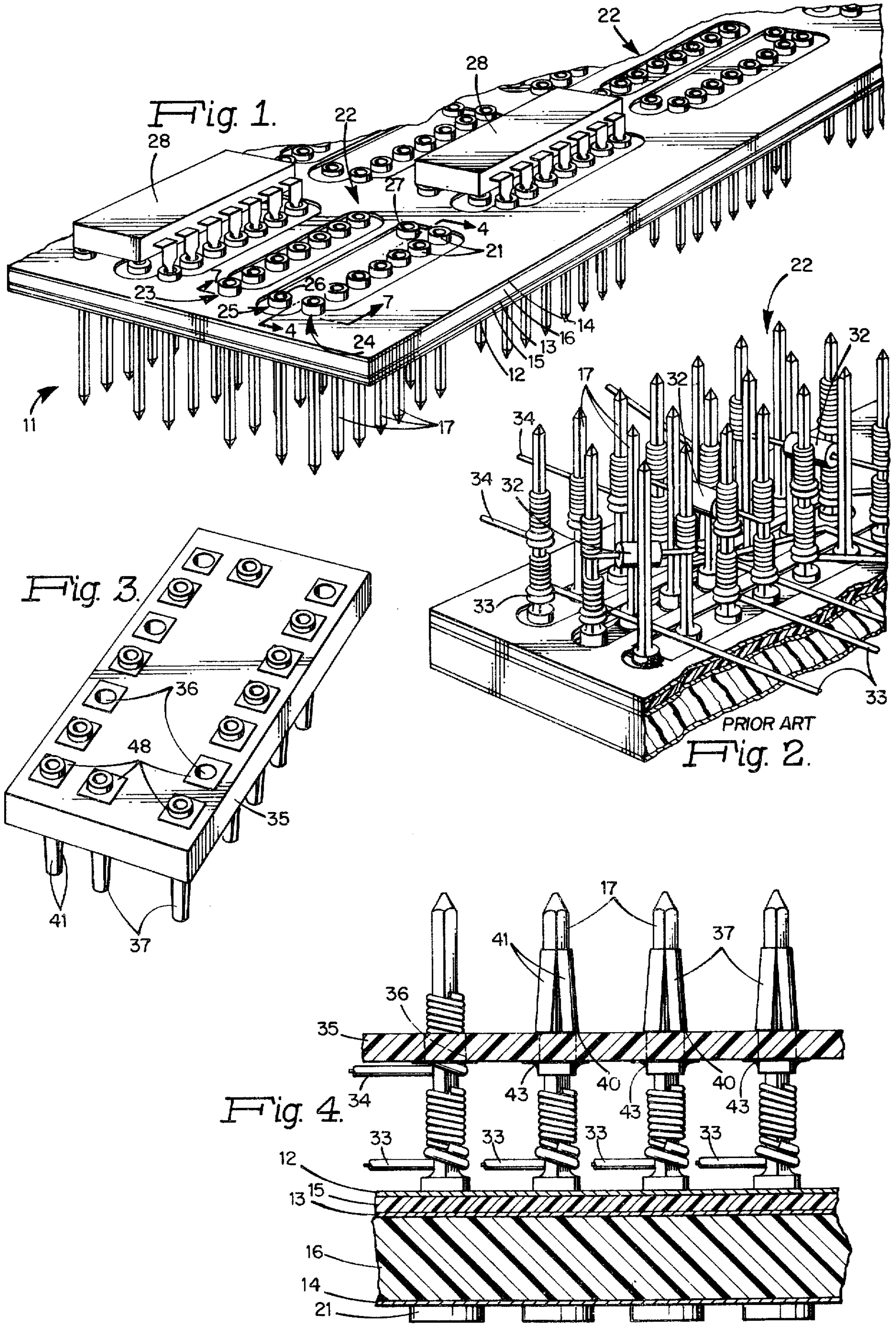
FIG. 1 is a perspective view of a panel board having wire wrapping socket-pins mounted therein.
FIG. 2 is a perspective broken-away view of a single array of wire wrapping pins showing the manner in which resistive terminations are accomplished in the prior art.
FIG. 3 is a perspective view of the under side of a dielectric substrate having a printed resistive network thereon as used in this invention.
FIG. 4 is a greatly enlarged partial sectional view taken on cutting plane 4—4 of FIG. 1 showing a portion of one row of wire wrapping pins having wires connected thereto and having the substrate of FIG. 3 mounted to the pins.

With reference now to the drawing, FIG. 1 is a perspective view of an electronic logic panel board 11 having three conductive planes 12, 13 and 14 separated by a dielectric such as epoxy layers 15 and 16. Wire wrapping pins 17 are mounted in board 11 having socket ends 21 extending through conductive layer 14 on the opposite side of the board from the projecting pins. The wire wrapping pins of this configuration may be referred to as socket pins. The array 22 of wire wrapping pins comprises two rows 23 and 24, normally comprising seven or more socket pins each, and row 25 comprising only two socket pins 26 and 27, one being located at each end of the row. Full rows 23, 24 are on 0.300 inch centers while row 25 is spaced from row 24 by 0.100 inch, thus maintaining modularity of spacing normally required for automatic wire wrapping. The pins in a row are spaced at 0.100 inch intervals. Integrated circuit packages 28 may be mounted in one, some or all of the arrays 22 of socket pins. The DIL's are also made with the modular 0.100 inch spacing between leads and fit within the sockets 21 of the pins.

An example of the prior art is shown in FIG. 2 wherein resistive terminations are provided by discrete resistors 32 connected between appropriate pins 17. It will be noted that some of the pins have one wire wrapped thereon, some of them have two and a few of them have no wires connected thereto. This is typical of the pins of a wire wrapping system. In center row 25 there are a full complement of pins 17, approximately half of which are tied together and electrically connected to the ground plane, the other half being tied together and electrically connected to one of the voltage planes. This arrangement is particularly applicable where discrete termination resistors are used since it would not be possible to connect several resistor leads to one ground plane pin. By having several pins tied together, wire wrapping of discrete resistor leads is facilitated.

Figures 5, 6, 7:
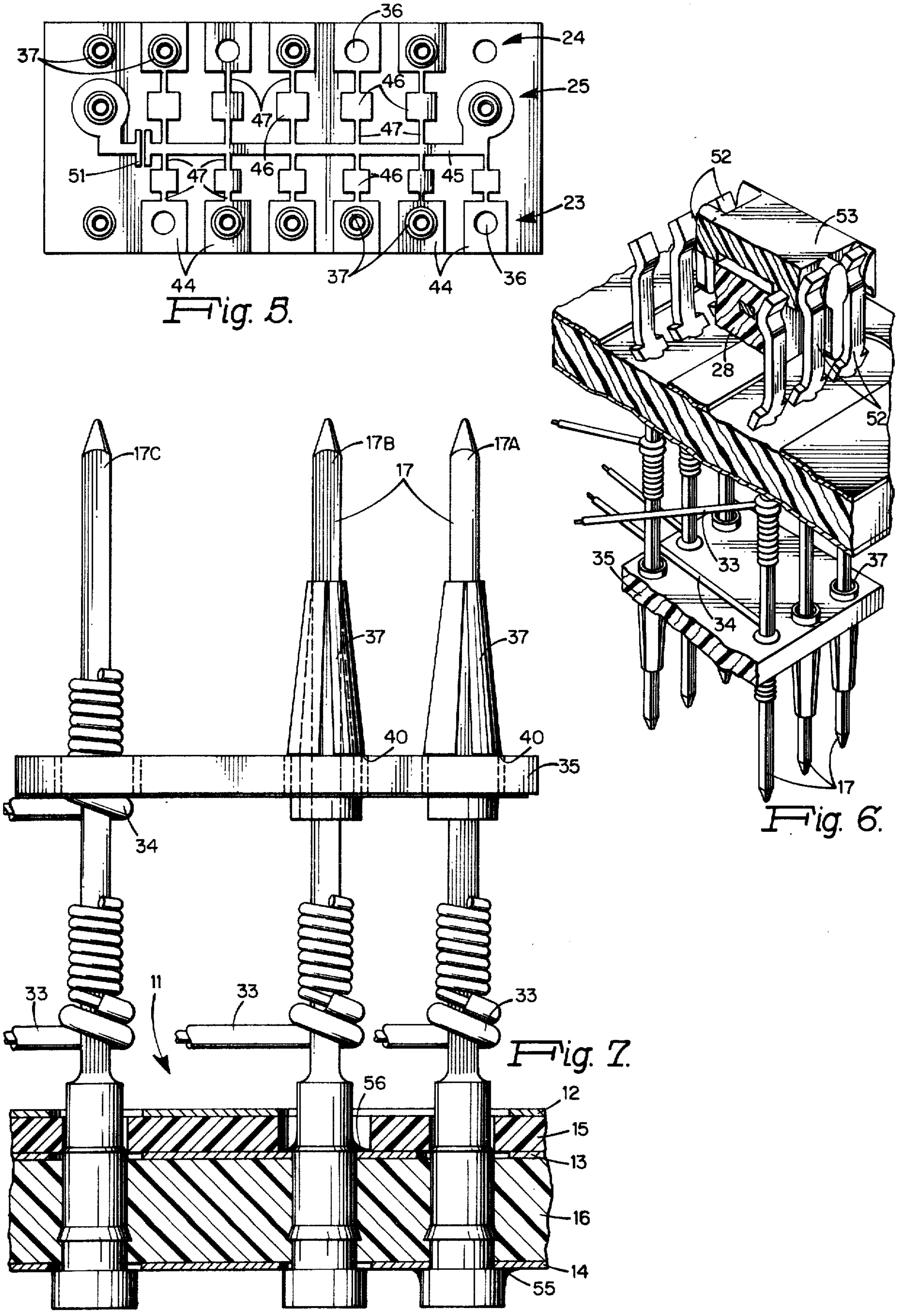
FIG. 5 is a plan view of the top side of the substrate of FIG. 3 showing the printed circuit thereon.
FIG. 6 is an alternative embodiment of the wire wrapping pins having resilient contacts rather than sockets on the opposite side of the panel board from the pins.
FIG. 7 is a greatly enlarged partial sectional view taken through cutting plan 7—7 of FIG. 1 showing the manner in which the pins of this invention are connected to various of the voltage planes of the panel board.

The invention is shown in detail in FIGS. 3–5. FIG. 4 is a greatly enlarged sectional view showing a portion of one row of pins 17 as they might appear in a completed structure. In a normal manner, approximately one and one-half turns of insulated wire 33 are wrapped around the base or proximal end of a pin 17 and several more turns of the stripped wire are tightly wrapped around the pin to make strong physical and electrical contact therewith. This wire wrapping coil occupies the first wire wrapping level. In some instances, a second wire 34 is wrapped around a pin 17 in the same manner and spaced further from panel board 11 along the length of a pin, occupying the second wire wrapping level. An electronic interconnection element such as dielectric substrate 35 having holes 36 therethrough, is fitted with electrically conductive contacts 37 in several of the holes. Each contact is formed as a thin cylinder with resilient fingers 41 which are bent inwardly to make positive contact with the sides of pin 17 and have shoulders 40 adjacent the point where fingers 41 are bent inwardly. These shoulders permit the contacts to be seated securely within holes 36 without the possibility of them being pushed through the hole. Substrate 35 has contact 37 mounted in each hole which corresponds with a pin 17 having only one wire or no wires wrapped thereon. Wherever a second wire 34 is wrapped on a pin, hole 36 is not provided with a contact member. The substrate is formed with the number and arrangement of holes to conform with the array 22 of pins in panel board 11. The rectangular configuration of the substrate is substantially similar to the overall outline shape of an array 22. The arrangement of clear holes 36 and contacts 37 conforms with the arrangement of two and one (or zero) level of wires wrapped on pins 17 respectfully in a single array. Thus when substrate 35 is applied to an array to which the wire wrapping connections have been made as shown in FIG. 4, the clear holes will align with pins having two levels of wire wrapped thereon while the contacts 37 will connect with pins having no more than one level of wire wrapped thereon. Thus there is no electrical connection between pins 17 and the printed circuitry on substrate 35 where there are two levels of wire wrapped on a pin while contacts 37 ensure positive electrical connection between the printed circuitry of the substrate and the wire wrapping pin. Each contact 37 is permanently mounted to substrate 35 by means of solder as indicated by filets 43. This soldering is made on the side of the substrate opposite to the printed circuitry to prevent the possibility of heat damage to the resistors 46. When there are two or more levels of wire wrapped on a pin there is no termination necessary because electrical connection has been made elsewhere. However, a pin having one or less coils of wire wrapped thereon may be at the end of a logic line and require resistive termination to ground. Thus contacts 37 are provided to make electrical connection between those pins and the printed circuit on substrate 35.

The printed circuitry on the top of substrate 35 is shown in FIG. 5 wherein a conductive pad 44 to which solder may be adhered surrounds each hole 36. A wide conductive path 45, functioning as a bus bar, is connected between the holes in interior row 25, adapted to be connected between pins 26 and 27 of that row. Resistive elements 46 printed on the substrate are connected by means of conductive paths 47 between each pad 44 and bus 45. All of the resistors 46 on a single substrate 35 are of the same value but different substrates may have resistors of different values, for example, 75 ohms, 100 ohms or 120 ohms. As shown in FIGS. 3 and 4, the electrical connection between the printed circuit on the top of the substrate and contacts 37 is made by means of solder 43 to conductive pads 48 (FIG. 3) on the bottom of the substrate. Holes 36 are conventional plated-through holes to provide the desired electrical connection between pads 44 and 48 on opposite sides of the substrate.

Not every resistor on a substrate will be used but a complete network of resistors is provided as desired. When a resistor is not employed in the circuit, conductive path 47 is broken by any convenient means such as a hollow end milling cutter which encompasses the rigid cylindrical end of the contact and is rotated to sever the contact from the printed circuitry, thereby effectively removing the resistor from the circuit and from connection with a pin 17. In order to ensure that no electrical connection is made between a pin and the printed circuitry on substrate 35, given the fact that holes 36 are lined with conductive material, the connection between pads 44 and resistors 46 is also physically severed in a similar manner. One of the conductive planes of board 11 is electrical ground and either pin 26 or 27 of interior row 25 is connected thereto. Therefore, bus 45 provides the necessary connection between a pin 17 through a resistor 46 to ground. A logic line, which may include several gates in integrated circuits mounted to the other side of the panel board, is thus terminated through an appropriate resistor to ground. A decoupling capacitor 51 may be included in the printed circuit on substrate 35 if necessary.

Instead of the socket pins shown in FIG. 1, the present invention may employ the resilient contact pins 52 as shown in FIG. 6. This arrangement permits the use of integrated circuit packages 28 with the conductive leads pointing either downward or upward when mounted in a special carrier 53 as shown. However, the opposite side of the panel board is identical with the ones shown in the previous figures, that is, it comprises only arrays of wire wrapping pins projecting therefrom, together with the wires connected to the pins, and substrates 35 mounted to the pins 17 above the wires wrapped upon them.

FIG. 7 is a greatly enlarged sectional view of the three pins at the beginning of each of rows 23, 24 and 25 and it indicates the manner in which these pins make contact with the various conductive layers of panel board 11. The pins which are securely mounted in holes through board 11 may be electrically connected with different ones of the conductive layers. For example, pin 17A of row 24 is soldered as indicated by reference numeral 55 to conductive layer 14 (normally ground) and no contact is made with conductive layers 13 and 14. A space between the hole through board 11 and conductive planes 12 and 13 is shown in the drawing. End pin 17B of center row 25 makes contact with internal conductive plane 13 as indicated by solder filet 56. Pin 17C is shown as making no electrical contact to any of the conductive planes 12, 13 or 14 of the panel board. The basic purpose of most of the pins of the array is to provide interconnection between the integrated circuits 28 (FIG. 1) mounted in the socket ends of the pins, and other integrated circuits or external terminations by means of wrapped wires 33 and 34. If it is assumed that pin 17B is connected to center voltage plane 13, then the other pin in row 25 would normally be connected electrically to the ground plane 14. This would comport with the configuration of the printed circuit shown in FIG. 5 where bus 45 extends between the two pins 26, 27 of interior row 25. The three layer board shown in the drawing is particularly applicable to ECL circuitry because of speed of switching which creates noise and possible oscillation problems where wires are used to connect to internal third voltage sources such as bus bars or other printed circuit boards.

While the preferred embodiment is shown as a combination of a printed circuit substrate, wire wrapping socket pins and a three-conductive layer panel board, it is immediately recognizable that any wire wrapping pin arrangement could be employed, such as that shown in FIG. 6 or there may be two conductive layers rather than the three discussed herein. Furthermore, it is also possible to include other elements on the printed circuit of substrate 35 rather than simply resistive terminations. Normally, substrate 35 is formed of a substantially rigid dielectric such as ceramic or an epoxy glass. The material does not matter; it merely must be substantially rigid and have sufficient strength so that with its preferred thickness of about 0.025 inch it can withstand the stresses involved in applying contacts 37 and mounting the substrate to an array 22 of pins. The holes 36 in the substrate will normally be approximately 0.080 inch in diameter, which is large enough to accommodate the wire wrapping coil about a pin.

Figure 8:
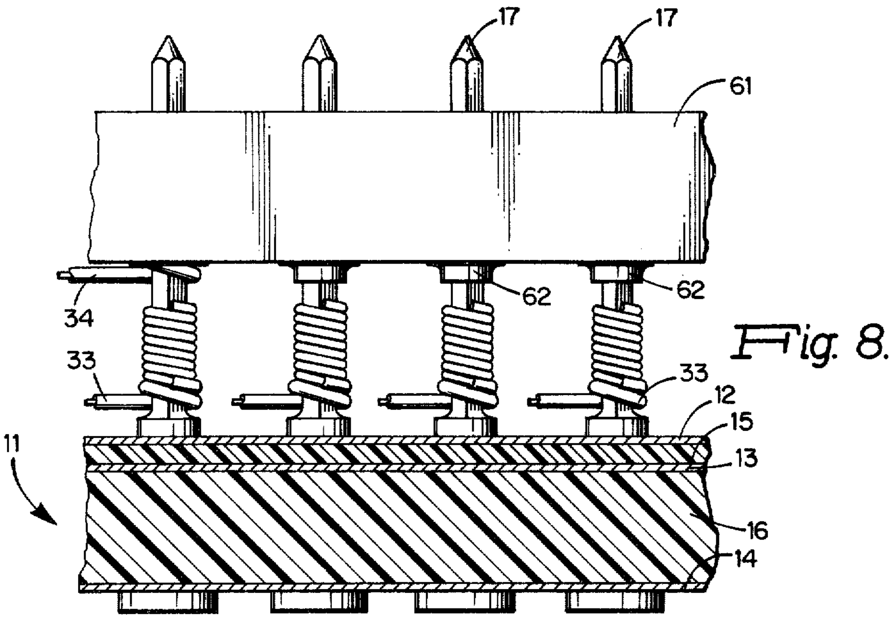
FIG. 8 is a greatly enlarged partial sectional view similar to FIG. 4 depicting an alternative embodiment of the invention.
Figure 9:
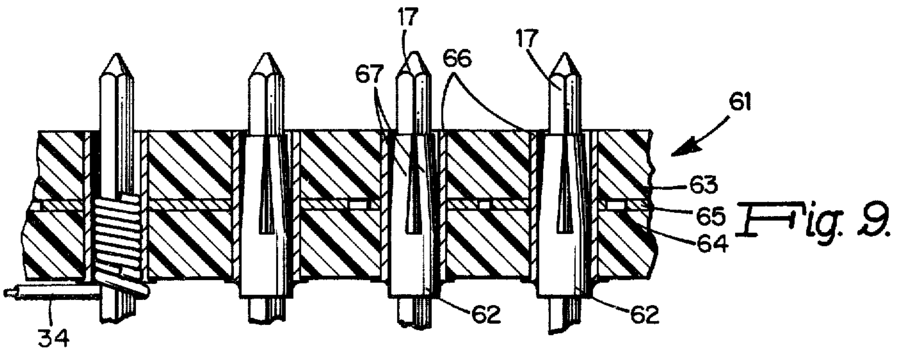
FIG. 9 is a greatly enlarged sectional view of the integrated circuit package shown in FIG. 8.

An alternative embodiment employing the principles of this invention is shown in FIGS. 8 and 9. Instead of the printed circuit substrate 35, the electronic interconnection element is a complete integrated circuit package 61 mounted to the wire wrapping pins. The thickness of the IC is approximately equal to the length of contacts 62, similar to contacts 37 previously described. These contacts do not have seating shoulders but they substantially occupy the holes through the IC. The contacts frictionally engage the plated sides 66 of the holes and may be soldered in a manner similar to contacts 37. Fingers 67 are bent inwardly to positively engage the sides of pins 17 to make electrical and physical contact therewith.

The integrated circuit is formed of layers 63 and 64 of dielectric material sandwiched around the integrated circuit layer 65 which is shown in a simplified schematic form.

It should be noted that wire wrapping coils 34 may be received within the holes through the IC in much the same manner as they are received within holes 36 in substrate 35. Also where there are two coils on a pin, there is no contact 62, while the pins having one or less wire wrapping coils are connected physically and electrically by contacts 62.

It may thus be seen that even higher density electronic circuitry is possible with this invention because a conventional IC may be connected on one side of the panel board and special IC 61 may be connected to the same pins on the other side of the board.

In view of the above specification, it is likely that modifications and improvements will occur to those skilled in the art which are within the scope of this invention.

What is claimed is:

1. A mounting and interconnection system for electronic logic circuitry, said system comprising:

a dielectric panel board;

a first conductive layer on a first side of said panel board;

a second conductive layer on the second side of said panel board;

a plurality of arrays of elongated pins mounted in said panel board and projecting substantially perpendicularly from said first side of said board, said elongated pins being wire wrapping pins, some of which have at least one interconnecting wire wrapped around it at the first wire wrapping level adjacent said board, some of said elongated pins having two interconnecting wires wrapped therearound, the second wrapping being located at the second wire wrapping level adjacent the first wire wrapping and spaced from the distal end of said pins;

an electronic interconnection element comprising printed circuitry mounted to dielectric material and having a plurality of holes therethrough to receive all the pins of one of said arrays, said printed circuitry being formed to selectively interconnect said holes, said electronic interconnection element comprising a flat dielectric substrate having a configuration substantially similar to the outline shape of one of said arrays, said holes in said substrate being of sufficient size to accomodate one of said pins and the coil of wire wrapped around it; and a plurality of contact members mounted in selected ones of said holes in said substrate, said contact members being configured to engage said pins, said selected holes in said substrate having contact members mounted therein corresponding to ones of said pins having less than two interconnecting wires wrapped therearound, the remaining holes in said substrate corresponding to said elongated pins having at least two interconnecting wires wrapped therearound;

wherein said substrate is mounted to said array of pins in a position substantially parallel to said panel board, said pins projecting through said substrate and said contact members.

2. The mounting and interconnection system recited in claim 1 wherein said contact members are electrically connected to said printed circuit on said substrate, thereby electrically connecting said pins passing through said selected holes to said printed circuit.

3. The mounting and interconnection system recited in claim 2 wherein the remaining holes in said substrate surround said second wrapping, there being no electrical connection between said pins passing through said remaining holes and said printed circuit.

4. The mounting and interconnection system recited in claim 3 wherein:

said contact members are elongated and hollow with a plurality of resilient contact fingers bent inwardly to positively engage one of said pins;

said printed circuitry comprises a plurality of resistors, each connected between a printed bus and one of said holes, said holes being surrounded on both sides of said substrate by a conductive pad to one of which said contact members are soldered, the interior surface of said holes being plated with a conductive material interconnecting the conductive pads on opposite ends of each of said holes;

said substrate resting upon the wire leading from said second wrapping and being held in place by means of said contact members engaging said pins.

5. A mounting and interconnection system for electronic logic circuitry, said system comprising:

a dielectric panel board;

a first conductive layer on a first side of said panel board;

a second conductive layer on the second side of said panel board;

a plurality of arrays of elongated pins mounted in said panel board and projecting substantially perpendicularly from said first side of said board, said elongated pins being wire wrapped pins, some of which have at least one interconnecting wire wrapping around it at the first wire wrapping level adjacent said board, some of said elongated pins having two interconnecting wires wrapped therearound, the second wrapping being located at the second wire wrapping level adjacent the first wire wrapping and spaced from the distal end of said pins;

an electronic interconnection element comprising printed circuitry mounted to dielectric material and having a plurality of holes therethrough to receive all of the pins of one of said arrays, said printed circuitry being formed to selectively interconnect said holes, said electronic interconnection elements comprising an integrated circuit package having a configuration substantially similar to the outline shape of one of said arrays, said printed circuitry including integrated circuit elements, said holes in said integrated circuit package being of sufficient size to accomodate one of said pins and the coil of wire wrapped around it; and a plurality of contact members mounted in selected ones of said holes in said substrate, said contact members being configured to engage said pins, said selected holes in said integrated circuit package having contact members mounted therein corresponding to ones of said pins having less than two interconnecting wires wrapped therearound, the remaining holes in said integrated circuit package corresponding to said elongated pins having at least two interconnecting wires wrapped therearound;

wherein said substrate is mounted to said array of pins in position substantially parallel to said panel board, said pins projecting through said substrate and said contact members.

6. The mounting and interconnection system recited in claim 1 wherein said contact members are electrically connected to said printed circuitry on said integrated circuit package, thereby electrically connecting said pins passing through said selected holes to said printed circuitry.

7. The mounting and interconnection system recited in claim 6 wherein the remaining holes in said integrated circuit package surround said second wrapping, there being no electrical connection between said pins passing through said remaining holes and said printed circuitry.

8. The mounting and interconnection system recited in claim 7 wherein:

said contact members are elongated and hollow with a plurality of resilient contact fingers bent inwardly to positively engage one of said pins;

said printed circuitry comprises a modular integrated circuit selectively interconnecting said holes, the interior surface of said holes being plated with a conductive material;

said integrated circuit package resting upon the wire leading from said second wrapping and being held in place by means of said contact members engaging said pins.

* * * * *

UNITED STATES PATENT OFFICE

CERTIFICATE OF CORRECTION

PATENT NO. : 3,891,898

DATED : June 24, 1975

INVENTOR(S) : Neil F. Damon

It is certified that error appears in the above-identified patent and that said Letters Patent are hereby corrected as shown below:

Column 8, line 41, "claim 1" should read --claim 5--.

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*